(12) United States Patent
Johnson

(10) Patent No.: US 6,323,437 B1
(45) Date of Patent: Nov. 27, 2001

(54) SPRING CLAMP ADAPTED FOR COUPLING WITH A CIRCUIT BOARD

(75) Inventor: Michael Gunnar Johnson, Sparta, NJ (US)

(73) Assignee: Lucent Technologies Inc., Murray Hill, DE (US)

(*) Notice: Subject to any disclaimer, the term of this patent is extended or adjusted under 35 U.S.C. 154(b) by 0 days.

(21) Appl. No.: 09/126,481

(22) Filed: Jul. 30, 1998

(51) Int. Cl.[7] .................................................. H05K 1/16
(52) U.S. Cl. ....................................... 174/260; 174/138 G
(58) Field of Search .............................. 174/260, 138 G; 361/760, 758, 759

(56) References Cited

U.S. PATENT DOCUMENTS

| | | | | |
|---|---|---|---|---|
| 4,595,794 | * | 6/1986 | Wasserman | 174/138 G |
| 5,099,392 | * | 3/1992 | Miller et al. | 361/400 |
| 5,282,111 | * | 1/1994 | Hopfer | 361/704 |
| 5,435,734 | * | 7/1995 | Chow | 439/69 |
| 5,561,594 | * | 10/1996 | Wakefield | 361/760 |
| 5,761,036 | * | 6/1998 | Hopfer et al. | 361/704 |

* cited by examiner

Primary Examiner—Jeffrey Gaffin
Assistant Examiner—Jeremy Norris
(74) Attorney, Agent, or Firm—Irena Lager

(57) ABSTRACT

A clamp for clamping an electronic component to a circuit board. The clamp has a frame capable of deflection, a spacer structure, and fasteners. The spacer structure has a first and second spacer. One, or both, of the spacers have an opening through at least a portion the spacer in the location where the spacer is positioned over the component. The opening places most of the force of the clamp on the walls of the package of the component. The walls can withstand more force than the lid of the package of the component because the walls are more rigid. This allows the clamp to exert a larger force on the component without cracking the thin lid of the package. The frame has a top section whose central portion is capable of deflection. The deflection of the frame allows the frame to absorb some of the force applied to by the clamp on the component to balance the force so that it is large enough to produce a sufficient electrical connection between the component and the circuit board, but not large enough to crack the component.

28 Claims, 7 Drawing Sheets

SPRING CLAMP ADAPTED FOR COUPLING WITH A CIRCUIT BOARD

FIELD OF THE INVENTION

This invention is related to clamps, and more particularly to spring clamps for electronic components.

BACKGROUND OF THE INVENTION

Components are usually integrated into a system by securing the components to an assembly. There are many ways to secure components to an assembly. Often, components are clamped to a circuit board. As shown in FIG. 1, components 14, 18 are clamped to circuit board 20 to hold components 14, 18 in place when components 14, 18 are being soldered into place. Additionally, components are clamped to the circuit board rather than being soldered to the circuit board when it is difficult to provide a secure solder connection between the components and the circuit board or when it is useful to be able to rework the components. This is particularly advantageous for expensive components. For example, if a component is attached to a circuit board by solder, the entire circuit board has to be heated to melt the solder connection and remove the component. Clamping the component to the circuit board allows the component to be easily removed and replaced, without affecting the other components on the circuit board.

FIG. 2a shows assembly 50 having component 52 clamped to circuit board 54 with clamp 56. Typically, circuit board 54 is connected to back plate 58. Clamp 56 has rigid metal bar 72, and more compliant bar 74, for example fabricated from FR4. Bars 72, 74 are fastened to circuit board 54 and back plate 58 with screws 76, 78. Circuit board 54 has an opening through which the bottom of component 52 contacts back plate 58. Referring to FIGS. 2a and 2b, component 52 is typically, one, or a plurality of semiconductor devices or integrated circuits (ICs) 60 housed in plastic or ceramic package 62. Package 62 has walls 77, 79 and lid 80. There is a thin conductive layer on the bottom of package 62 referred to as a flange. Flange 64 is electrically coupled to the bottom of device or IC 60. Leads 68, 70 of component 52 contact circuit board 54. Clamp 56 has to apply enough force to component 52 to press component 52 tightly enough to the rest of assembly 50 to ensure that there is a sufficient electrical connection between flange 64 and back plate 58 and between leads 68, 70 and circuit board 54. Screws 76, 78 hold bars 72, 74 tightly to component 52 so that bars 72, 74 apply force to component 52.

A problem with using clamp 56 to attach component 52 to circuit board 54 and back plate 58 is that when clamp 56 applies enough force to component 52 to ensure sufficient electrical connection a significant amount of force is asserted against lid 80. For example, in an RF transistor 250 to 300 lbs./sq.in. of force may be needed to ensure sufficient electrical connection. The thin lid of the package of many components is too thin to withstand this much force, causing the package to crack.

Furthermore, the force exerted by clamp 56 varies based on the tolerances of screws 76, 78 and the coefficient of friction between screws 76, 78 and back plate 58. This force will vary from clamp to clamp and screw to screw. Therefore, to ensure a sufficient electrical connection in the worst case, more force than the 250 to 300 lbs./sq.in. has to be applied. This force is often large enough to crack lid 80 of many components.

Another problem with using clamp 56 to attach component 52 to circuit board 54 and back plate 58 is that the tolerances of package 62 do not ensure that clamp 56 will evenly press against component 52 to ensure a sufficient electrical connection. The tolerances in manufacturing package 62 allow for a package that is not completely flat. When clamp 56 presses against component 52, because metal bar 72 is rigid, gap 81 forms between bar 74 and component 52, even though bar 74 is somewhat compliant. Clamp 56 does not apply enough force to the portion of component 52 under gap 81. This may cause an insufficient electrical connection between the portion of flange 64 under gap 81 and back plate 58, so component 52 does not function acceptably.

To get a better electrical connection, more force can be applied on component 52 by clamp 56. However, now the force on taller side 82 of the package is even greater. Often this force is too great for lid 80 of many components to withstand, causing the package to crack and rendering component 52 useless.

Yet another problem with fastening component 52 to assembly 50 is that when clamp 56 is being fastened it can easily crack component 52 as shown in FIG. 3. Clamp 56 can be fastened to assembly 50 by either first tightening screw 76 fully into place and then tightening the other screw, or by gradually tightening each screw while constantly alternating between the two screws. Tightening screw 76 fully places all of the force of clamp 56 on corner 82 of component 52, crushing corner 82. This can cause a crack to start in corner 82, which will then spread to the rest of the top of the package of component 52, rendering component 52 useless. Gradually tightening each screw while constantly alternating between the two screws reduces this problem, however, it is much more time and labor intensive, which greatly increases the time and cost of the assembly.

SUMMARY OF THE INVENTION

The invention solves the above problems by providing a spring clamp for fastening a component to an assembly. The spring clamp provides a sufficient and adequately even electrical connection between the component and the rest of the assembly by providing deflection in the frame of the clamp. The force applied by the clamp to the component can be adjusted because of the deflection of the clamp. This allows the clamp to apply enough force to produce a sufficient electrical connection between the component and the rest of the assembly, but not enough force to crack the component. One section of the frame can have a different angle of deflection than another section of the frame, allowing the clamp to adjust when the top of the package of the component is not flat. The fact that the sections of the frame can have different amounts of deflection, and the clamp's ability to adjust the force that it applies to the component allows the clamp's fasteners to be tightened independently without putting so much force on the side of the component closest to the fastener that this side cracks.

Furthermore, the spring clamp prevents cracking of the component's package by applying much of the clamping force on the walls of the package rather than on the center of the package lid. The walls can support more force than the lid because the walls of the package are more rigid than the lid. This allows the clamp to exert a larger force on the component without cracking the package.

The spring clamp has a frame, a spacer structure, and fasteners. Preferably, the spacer structure has a first and second spacer. In one embodiment of the invention, the frame of the clamp has a top section whose central portion is capable of deflection. The deflection in the frame varies based on the size and shape of the component. This allows the clamp to apply enough force to all of the component to produce a sufficient electrical connection between the component and the assembly. In another embodiment of the invention, one or both, of the spacers have an opening through at least a portion the spacer in the location where the spacer is positioned over the component. The opening places most of the force of the clamp on the walls of the component package.

BRIEF DESCRIPTION OF THE DRAWINGS

It should be noted that the Figures are drawn to best illustrate preferred embodiments of the invention and are not drawn to scale.

FIG. 9b is a cross-sectional view of an assembly having a circuit board and a component attached to the circuit board by a spring clamp having the spacers of FIG. 9a;

DETAILED DESCRIPTION

Figure 1:
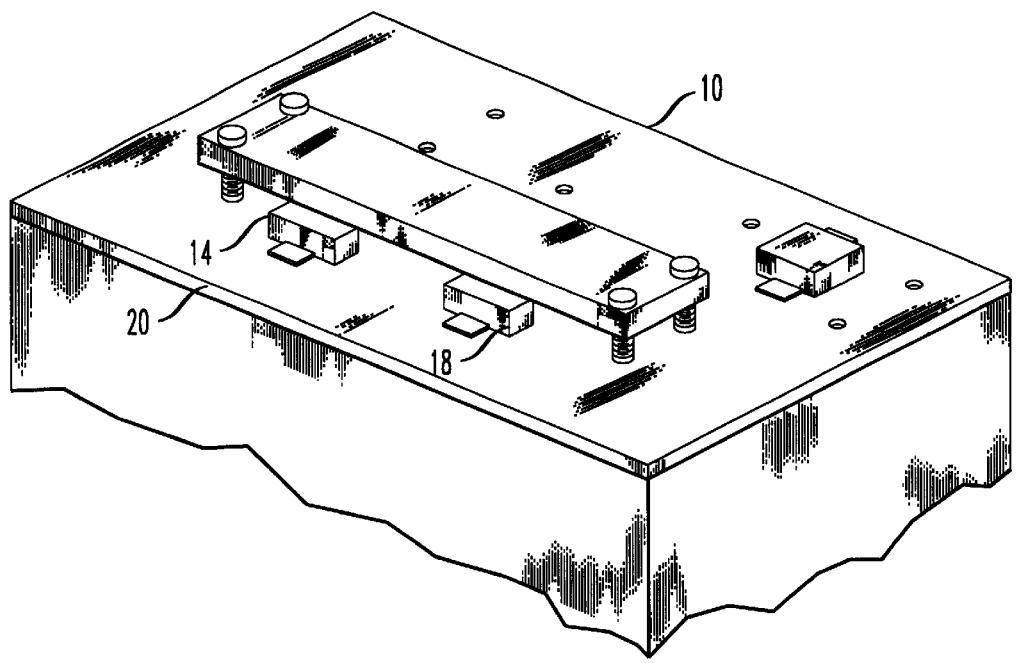
FIG. 1 is a perspective view of a circuit board and components clamped to the circuit board during the soldering process.
Figure 2A:
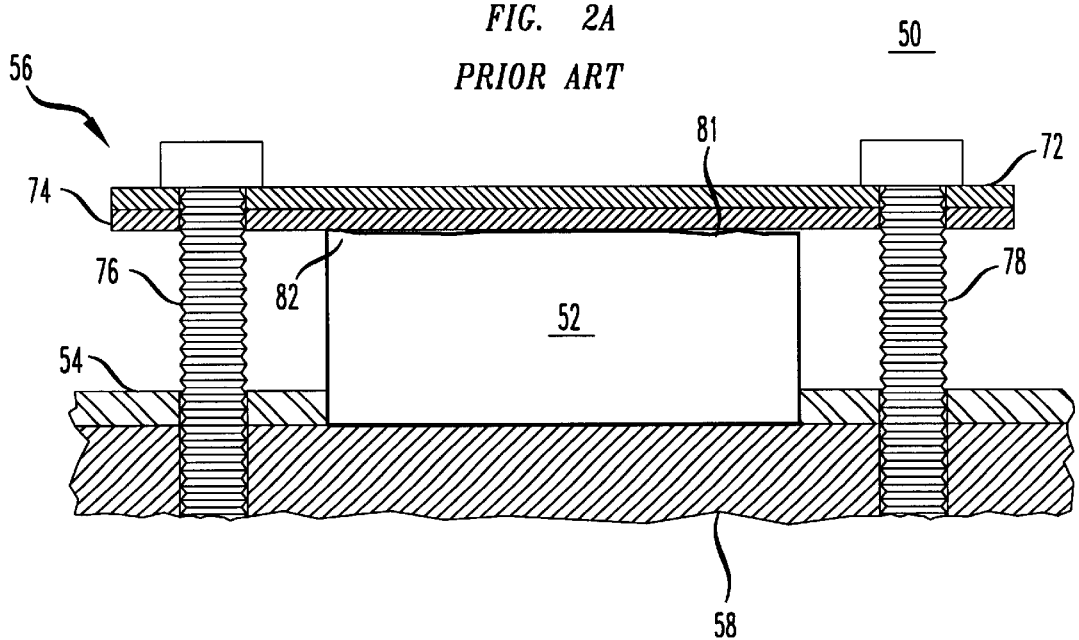
FIG. 2a is a cross-section of an assembly having a circuit board and a component clamped to the circuit board by a conventional clamp.
Figure 2B:
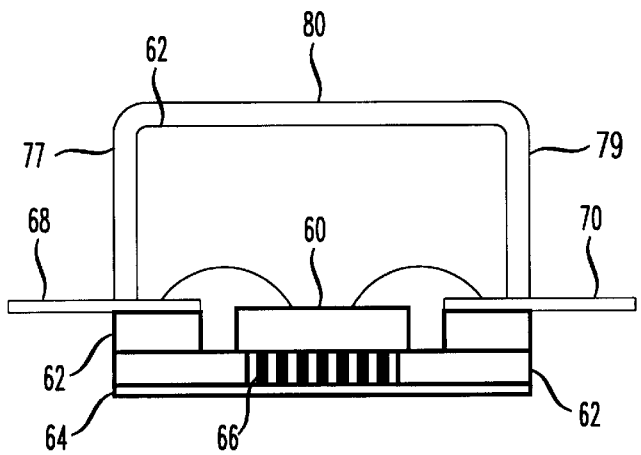
FIG. 2b is a cross-section of a component.
Figure 3:
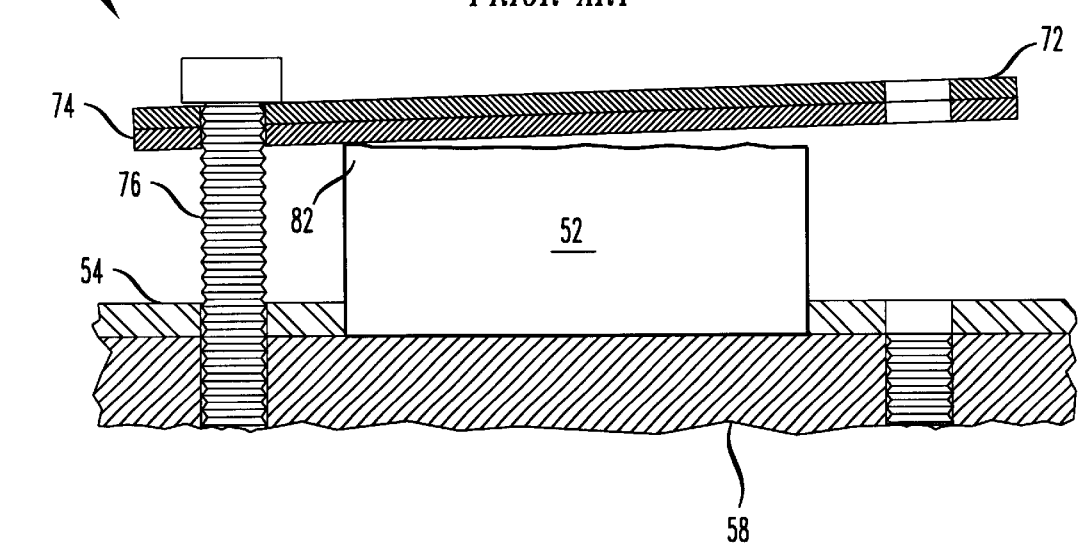
FIG. 3 is a cross-section of an assembly having a circuit board and a component being clamped to the circuit board by a conventional clamp.
Figure 4:
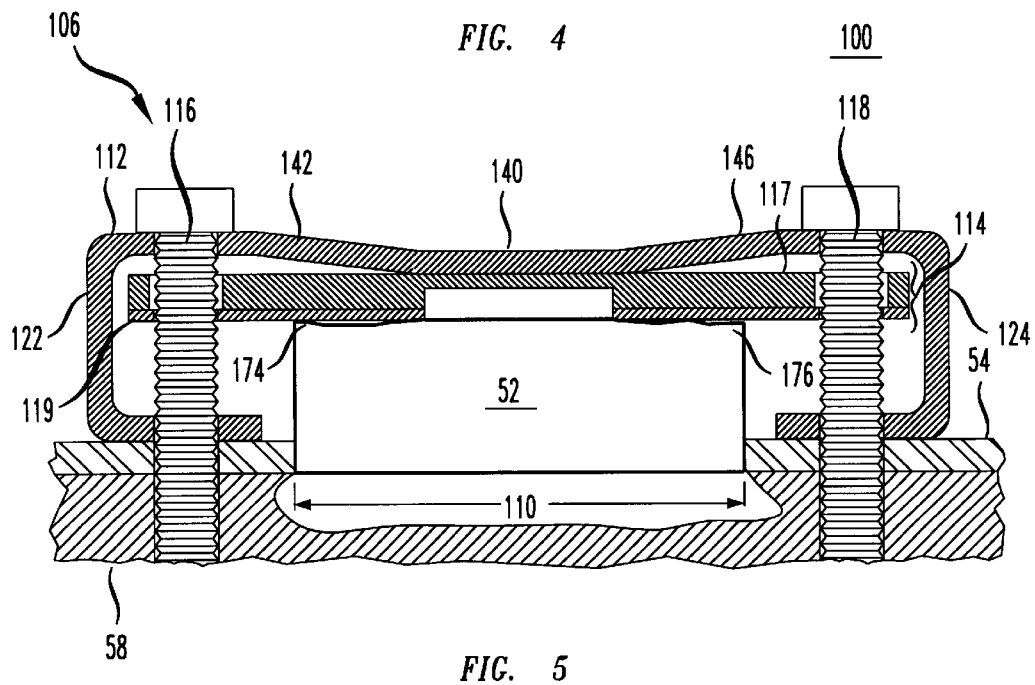
FIG. 4 is a cross-sectional view of an assembly having a circuit board and a component attached to the circuit board by a spring clamp.

Referring to FIG. 4, an assembly according to an embodiment of the present invention is generally designated by reference numeral 100. Assembly 100 includes component 52 coupled to circuit board 54, with clamp 106. Optionally, the assembly can also include back plate 58 attached to circuit board 54 and in contact with component 52.

Circuit board 54 may be a single-layer or multi-layer circuit board designed to receive components. Circuit board 54 has opening 110 that goes completely through circuit board 54. Component 52 fits through opening 110. The component 52 can be an integrated circuit or discrete device that connects to circuit board 54 through leads (not shown) and to back plate 58 through a flange on the bottom of component 52.

Figure 5:
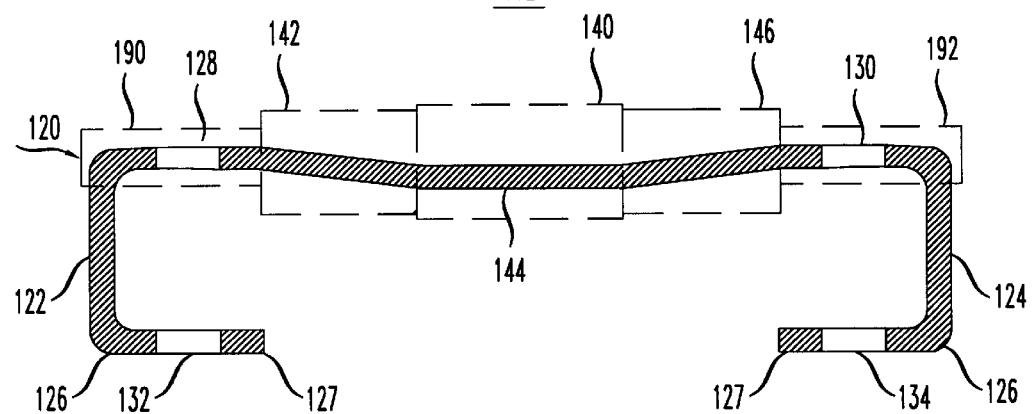
FIG. 5 is a cross-sectional view a frame of the spring clamp of FIG. 4.
Figure 6:
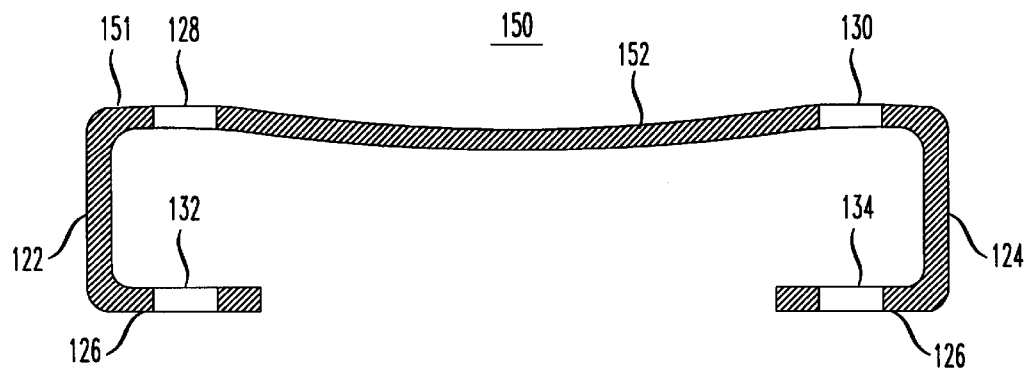
FIG. 6 is a cross-sectional view of another frame of the spring clamp of FIG. 4.

Clamp 106 has spring frame 112, spacer structure 114, and fasteners, such as screws 116, 118, although the fasteners can be any fasteners that can tightly attach frame 112, and spacer structure 114 to circuit board 54. Spacer structure 114 includes first spacer 117 and compliant second spacer 119 that have openings for screws 116, 118. Referring to FIG. 5, frame 112 has top section 120, sides 122, 124, and bottom section 126 with component opening 127. Top section 120 and bottom section 126 have openings 128, 130, and 132, 134, respectively, for screws 116, 118. Top section 120 has deflected central portion 140 and outer portions 190, 192. Central portion 140 contains segments 142, 144, 146. Segments 142 and 146 are angled to produce the deflection, and segment 144 is straight. FIG. 6 shows an alternative frame 150 that can be used with clamp 106. Frame 150 also has sides 122, 124 and bottom section 126. Frame 150 has top section 151 with deflected central portion 152 produced by one rounded section. Rounded central portion 152 distributes the force applied by frame 150 more evenly, however frame 112 may be easier to manufacture because segments 142, 144, 146 are straight. The central portion of the frame may be any shape that allows for deflection and for spring type movement of the central portion to change the amount of deflection.

The frame is fabricated from a material that has a high yield strength, so that the frame remains compliant when a large amount of force is applied to the frame. When the frame is applying force to the component, the amount of deflection changes, producing stress on the frame. Preferably, the stress on the frame is less that 70% of the yield strength of the material of the frame. The material should remain compliant at high temperatures such as reflow soldering temperatures. This allows the clamp to be used to keep the component in place during soldering without losing the clamp's compliance. The material should also be as non-magnetic as possible, to reduce the magnetic coupling between the frame and the component. Preferably, when the component is an RF transistor that requires 250 to 300 lbs./sq.in. of force, frame 112 is made out of a compliant material that has a yield strength of about 150,000 to 180,000 lbs./sq.in. such as alloy 25 beryllium copper. Optionally, the beryllium copper can be plated for corrosion protection. Depending on the conditions the clamp will be exposed and required clamping force, other spring material such as other beryllium copper alloys, stainless steel alloys, or phosphor bronze alloys can be used to manufacture the frame.

Figure 7:
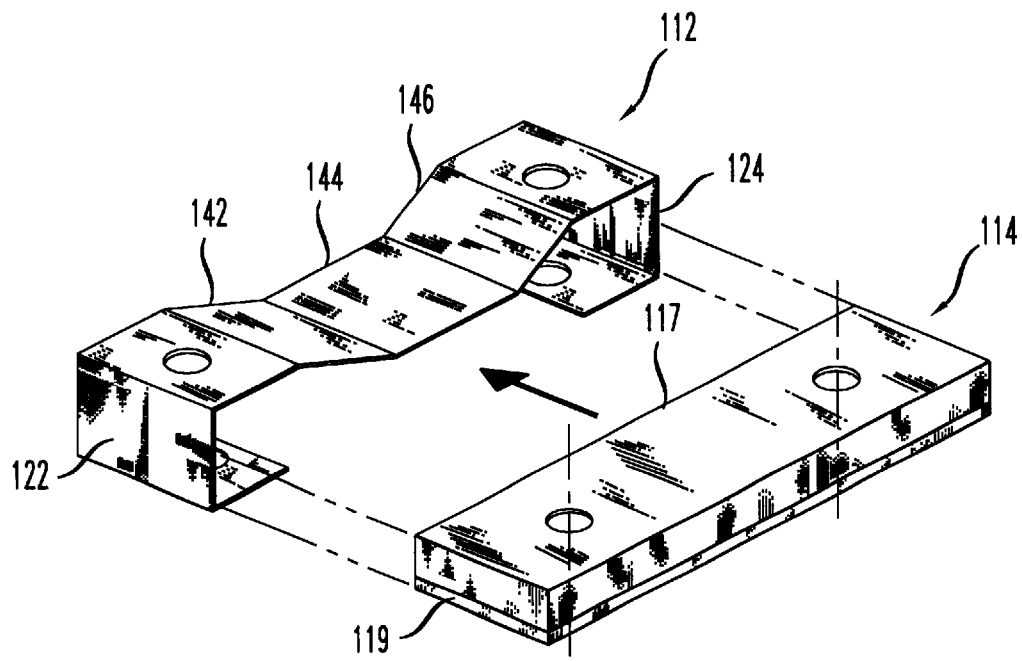
FIG. 7 is a perspective view of the spacer structure being inserted into the frame.
Figure 8:
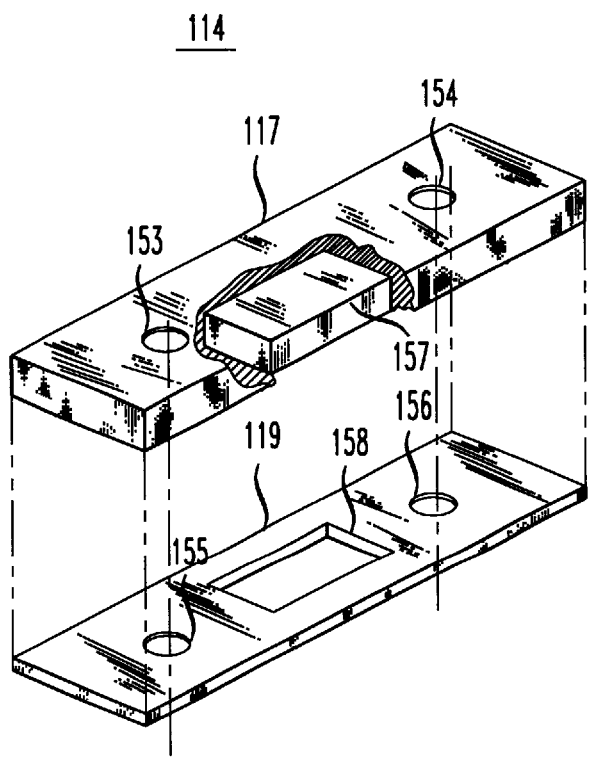
FIG. 8 is a perspective view of the first and second spacers.

As shown in FIG. 7, spacer structure 114 fits into frame 112. FIG. 8 is an exploded view of spacer structure 114. Spacer structure 114 includes first spacer 117 and second spacer 119. First spacer 117 is fabricated from a metal, such as aluminum, and second spacer 119 is fabricated from compliant material such as TEFLON™, or silicon rubber, or even FR4. Both spacers 117, 119 have openings 153, 154, and 155, 156, respectively, for the fasteners. Optionally, openings 155, 156 can be made such that there is a large amount of friction between second spacer 119 and screws 116, 118 so that screws 116, 118 are held in place by second spacer 119. This allows clamp 106 to be pre-assembled and remain assembled before clamp 106 is attached to assembly, saving time and money in the manufacturing process. For example, for a thin, about 0.05 in. thick, TEFLON™ second spacer 119, openings 155, 156 can be made by just an incision in second spacer 119, without removing any material.

Referring to FIGS. 4 and 8 concurrently, first spacer 117 also has opening 157 centered in the area of first spacer 117 that fits over the center of component 52. Optionally, second spacer 119 also has opening 158 positioned under opening 157. However, if second spacer 119 is thin and flexible enough such that compared to first spacer 117 second spacer 119 exerts a small amount of force on component 52, opening 158 is not made in second spacer 119. The sum of the depth of openings 157 and 158, should be thick enough to make sure that the capacitive coupling between metal frame 112 and component 52 and between first spacer 117 and component 52 is at an acceptably low level. The edges of openings 157 and 158 are positioned a small distance from the edges of the package of component 52. This distance is based on the thickness of the walls of the package, as the thickness of the walls of the package increases so does the distance of how far from the edges of the package of component 52 openings 157, 158 start. For example openings 157 and 158 are 0.050 in from the edges of the lid of component 52 when the walls of the package of component 52 are 0.05 in thick. Openings 157, 158 are positioned such that the walls of component 52 are under spacers 117, 119 and the center of the lid of component 52 is under openings 157, 158. This puts most of the clamping force of clamp 106 on the walls of component 52. The walls of component 52 can support more force than the thin lid of the package of component 52 because the walls are more rigid. Applying the force to the walls of component 52 presses the entire component 52 to circuit board 54 with enough force to ensure that component 52 has good electrical contact with circuit board 54 and back plate 58. It is preferable to use both the first and second spacer in the spacer structure 114, the first spacer 117 ensures that a large enough amount of force is used, and the second spacer 119 allows the spacer structure to adjust to the shape of the top of component 52. However, the spacer structure can be either just first spacer 117, or second spacer 119.

Referring to FIG. 4, screws 116, 118 go through the openings in frame 112 and in first and second spacers 117, 119 and into circuit board 54 and back plate 58. Screws 116, 118 tighten clamp 106 against assembly 100. Frame 112 presses against first spacer 117, which presses against second spacer 119, which in turn presses against the edges of component 52 to apply force on component 52 and presses the leads of component 52 to circuit board 54 and the flange of component 52 to back plate 58. Component 52 applies force back on spacer structure 114 and therefore on frame 112. This causes a change in the deflection of central portion 140 of frame 112, which acts like a spring to regulate the force applied to component 52 regardless of the force exerted when screws 116, 118 are fully torqued into place. Additionally, when the assembly is put in the reflow oven the package of component 52 expands, applying force on clamp 106. Clamp 106 regulates this force by changing the deflection of central portion 140. Thus, clamp 106 unlike the rigid bar of the prior art, regulates its force to produce enough force to ensure a sufficient electrical connection between component 52 and the rest of assembly 100, yet not enough force to crack component 52. The appropriate amount of force to apply to component 52 will vary with the component, and should be provided in the component's specifications. For example, in an RF transistor 250 to 300 lbs./sq.in. of force may be needed to ensure sufficient electrical connection, yet a larger force, for example of 400 lbs./sq.in. may crack the top of the component's package.

Sides 122, 124 absorb most of the force exerted when screws 116, 118 are torqued into place. The force exerted when screws are torqued into place is dependent on the tolerances of the screws and the coefficient of friction between screws. This force will vary from clamp to clamp and screw to screw. Therefore, because this force is mostly absorbed by sides 122, 124, the force exerted on component 52 by clamp 106 is much more consistent amongst individual clamps 106, unlike for the clamps of the prior art that used the rigid bar.

The force exerted by clamp 106 on component 52 is dependent on the thickness of spacer structure 114, the material from which spacer structure 114 is fabricated, the deflection of central portion 140 of frame 112, the spring constant of the material from which the frame is fabricated, and the thickness of the circuit board. An increase in the thickness of spacer structure 114 causes a greater deflection in the spring increasing the force on component 52. The thickness of spacer structure 114 can be increased by increasing the thickness of either the first 117 or the second spacer 119. However, the insulator material out of which second spacer 119 is manufactures can flow out when subject to the over 200° C. temperatures of a reflow oven. Therefore, if clamp 106 will be used to keep component 52 in place during soldering, second insulator 119 has to be kept to thin to ensure that the thickness of spacer structure 114 does not change significantly during reflow. For example, for a 0.115 in. spacer structure 114 a 0.112 in. thick aluminum first spacer 117, a 0.003 in. thick FR4 second spacer 119 can be used.

The clamps ability to vary the force on component 52 is also dependent of the amount of deflection frame 112 is capable of providing. The larger the amount of deflection frame 112 can provide, the larger is the range of force clamp 106 can produce. As clamp 106 is tightened, if the force is large enough the deflection of central portion 140 decreases. This produces less force on component 52 than if the frame was rigid and did not deflect at all. The amount of deflection of frame 112 should be balanced between being large enough to not produce the excess force that would be produced if the frame was rigid, so the component does not crack; yet not large enough to produce an insufficient electrical connection between component 52 and the rest of the assembly.

By varying the thickness and the material of spacer structure 114, and the amount of deflection of which frame 112 is capable, clamp 106 can be made to apply any desired amount of force. Conventional modeling tools, such as finite element analysis tools, for example ALGOR or ANSYS, can be used to determine any one of these criteria when the structure of the clamp is according to the present invention, the thickness of the circuit board is known, and the other two criteria are set. For example, for a component that requires 250 to 300 lbs./sq.in., such as an RF transistor, clamp 106 can have a 0.115 in. spacer structure 114 and a frame having a deflection of 0.020 in. for a circuit board 0.020 in thick.

Clamp 106's ability to change the amount of force it can apply to component 52 allows clamp 106 to be used for different applications with minimal adjustment. The thickness of spacer structure is typically the easiest and least expensive of the factors to vary. For example, a thinner spacer structure can be used to provide enough force to hold a component in place while the component is soldered onto a circuit board, typically 3 to 5 lbs./sq.in. The same clamp with a thicker spacer structure can be used to produce the 250 to 300 lbs./sq.in. of force needed to clamp an RF transistor to a circuit board. A spacer structure of another thickness can be used to produce the force needed by a different component. This also allows the clamp to be adjusted easily, quickly, and economically if the component's requirements change during the design phase.

Another advantage of clamp 106 is that the angled sections of central portion 140 of frame 112 can change deflection independently of each other, so the deflection of one side of central portion 140 can be larger than the deflection of the other side. The tolerances of the package of component 52 allow for a package where the top is not completely flat. When the top of the package of component 52 is not completely flat, for example edge 176 is shorter than edge 174, angled section 146 remains more angled than angled section 142 and there is no gap between component 52 and clamp 106. This allows clamp 106 to apply sufficient force to all of component 52 notwithstanding the component's irregular top surface, to produce a sufficient electrical connection between component 52 and back plate 58.

Figure 9A:
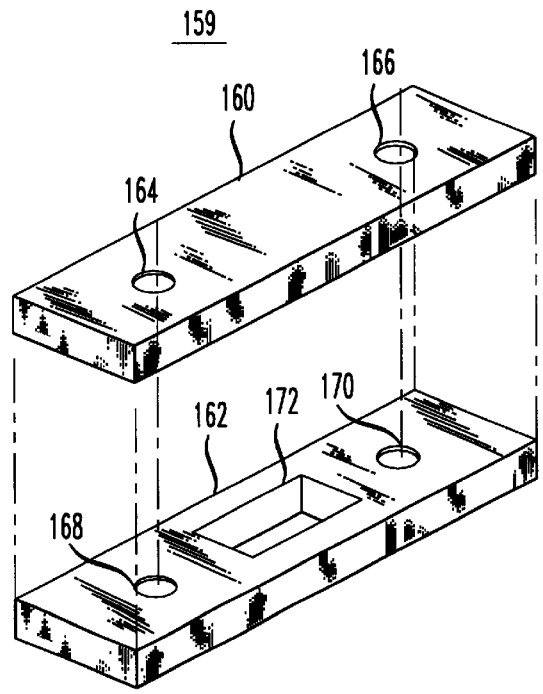
FIG. 9a is a perspective view of an alternative first and second spacers.

FIG. 9a shows an exploded view of alternative embodiment of the spacer structure. Spacer structure 159 includes first spacer 160 and second spacer 162. The spacers 160, 162 are fabricated from a compliant material such as silicon rubber, or FR4. One or both of the spacers can also be fabricated from TEFLON™. However, TEFLON™ may flow out over time, reducing its thickness, therefore the spacers made out of TEFLON™ should be thin to avoid a large change in the thickness of the insulator structure due to the change in the height of the insulator manufactured from TEFLON™.

Figure 9B:
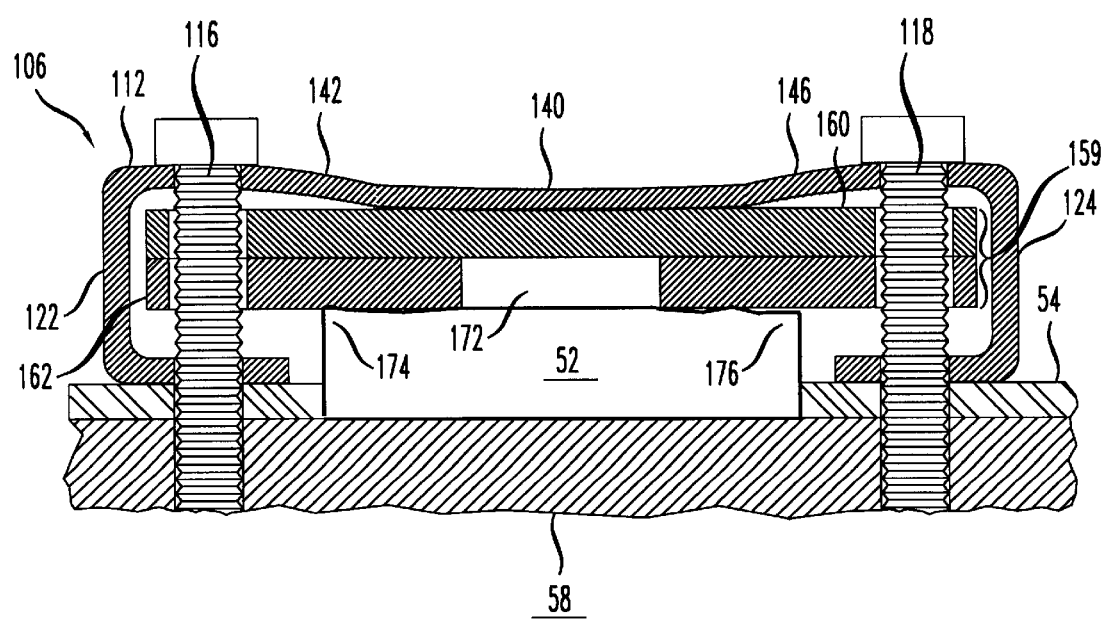

Spacers fabricated from a harder material such as FR4 will exert more force than TEFLON™ which will exert more force than spacers from an even softer material such as silicon rubber. The two spacers 160, 162 can be fabricated from the same or from different compliant materials. Both spacers 160, 162 have openings 164, 166, and 168, 170, respectively, for the fasteners. Preferably, first spacer 160 does not have other openings, so that first spacer 160 distributes the force applied by the clamp evenly. Referring to FIGS. 9a and 9b concurrently, second spacer 162 has opening 172 centered in the area of second spacer 162 that fits over the center of component 52. The edges of opening 172 are positioned a small distance from the edges of the package of component 52. This distance is based on the thickness of the walls of the package, as the thickness of the walls of the package increases so does the distance of how far from the edges of the package of component 52 opening 172 starts. For example, opening 172 is 0.050 in from the edges of the lid of component 52 when the walls of the package of component 52 are 0.05 in thick. Opening 172 is positioned such that the walls of component 52 are under spacers 160, 162 and the center of the lid of component 52 is under opening 172, putting most of the clamping force of clamp 106 on the walls of component 52. Alternatively, the spacer structure can be either just first spacer 160, or second spacer 162.

Screws 116, 118 go through the openings in frame 112 and in first and second spacers 160, 162 and into circuit board 54 and back plate 58. Screws 116, 118 tighten clamp 106 against assembly 100. Frame 112 presses against first spacer 160, which presses against second spacer 162, which in turn presses against the edges of component 52 to apply force on component 52 and press component 52 to circuit board 54 and to back plate 58. Component 52 applies force back on spacer structure 159 and therefore on frame 112. This causes a change in the deflection of central portion 140 of frame 112 to regulate the force applied on component 52. Thus, clamp 106 produces enough force to ensure a sufficient electrical connection between component 52 and the rest of assembly 178, yet not enough force to crack component 52.

By varying the thickness and the material of spacer structure 159, and the amount of deflection of which frame 112 is capable, clamp 106 can be made to apply any desired amount of force. Conventional modeling tools can be used to determine any one of these criteria when the structure of the clamp is according to the present invention and the other two criteria are set. For example, for a component that requires 250 to 300 lbs./sq.in., such as an RF transistor, clamp 106 can have a 0.115 in. thick FR4 spacer structure 159, and a frame having a deflection of 0.020 in.

Referring again to FIG. 4, frame 112's capability to have the sections of central portion 140 at different angles allows one of the screws 116, 118 to be fully tightened before the other screw is tightened without cracking the corner of component 52 adjacent to the tightened screw. As one of the screws 116, 118 is tightened, the angled section of central portion 140 adjacent to the screw moves toward circuit board 54, changing the deflection of that section, absorbing some of the force on the corner of component 52 and more evenly distributing the force on the corners of component 52. Being able to tighten each screw completely without having to alternate between the two screws 116, 118 as each is being tightened reduces the time and labor need to put clamp 106 in place, which reduces the time and cost of assembly 100. Furthermore, because of the shape of frame 112, clamp 106 can be preassembled, also reducing the labor and time of fastening clamp 106 to circuit board 54.

Figure 10A:
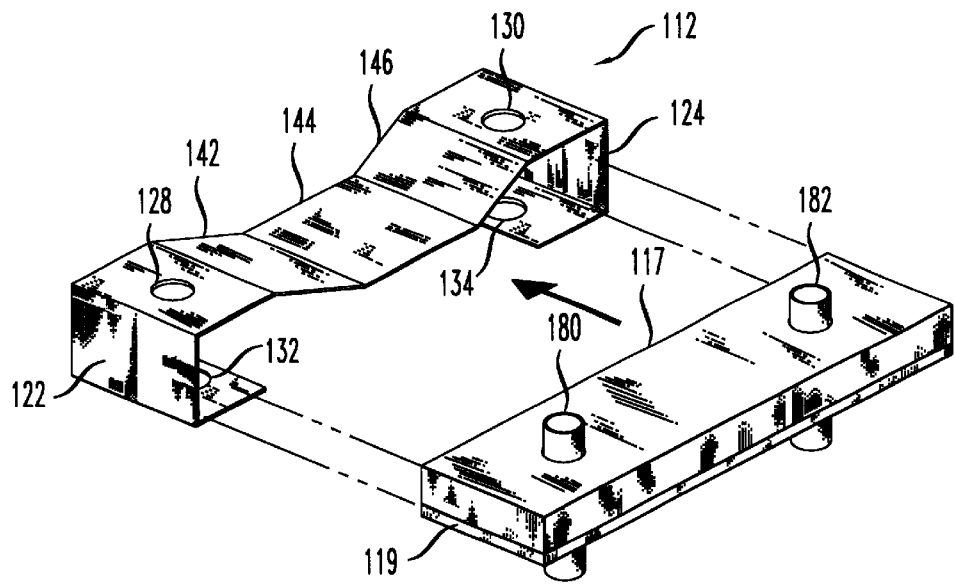
FIG. 10a is a perspective view of the spacer structure and standoffs being inserted into the frame.
Figure 10B:
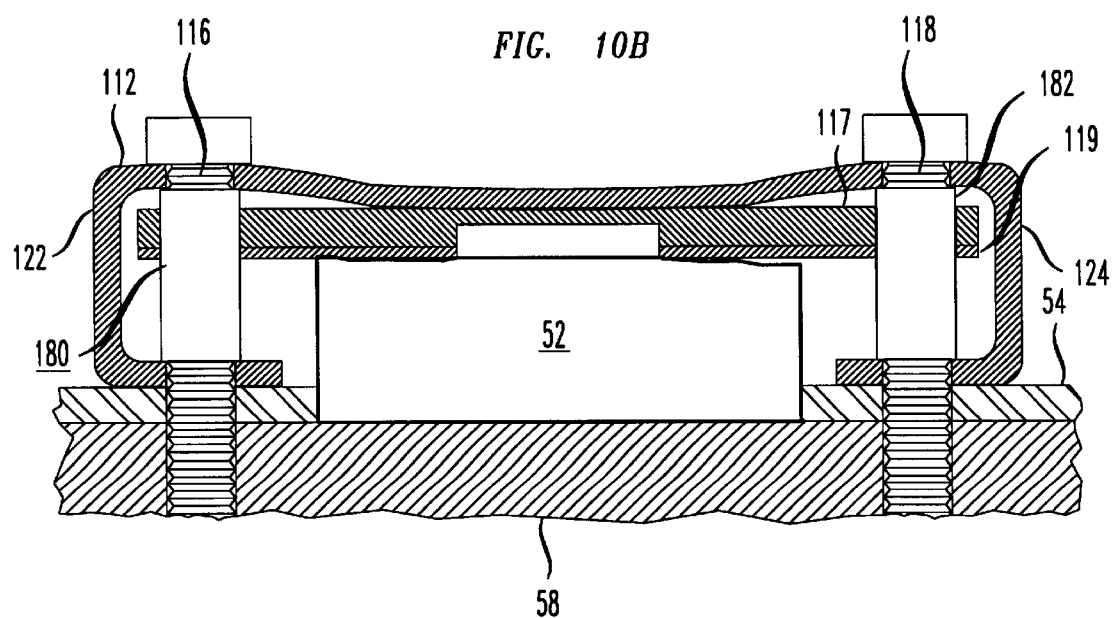
FIG. 10b is a cross-sectional view of an assembly having a circuit board and a component attached to the circuit board by a spring clamp having standoffs.

Referring to FIG. 10a, optionally, standoffs 180, 182 are added to the clamp through the openings in the spacer structure. Referring to FIG. 10b, standoffs 180, 182 press fit vertically into frame 112 and, like sides 122, 124, absorb some of the force produced by screws 116, 118. The standoffs help to prevent any bending or deflection of outer portions 190, 192 of top section of frame 112.

Figure 11:
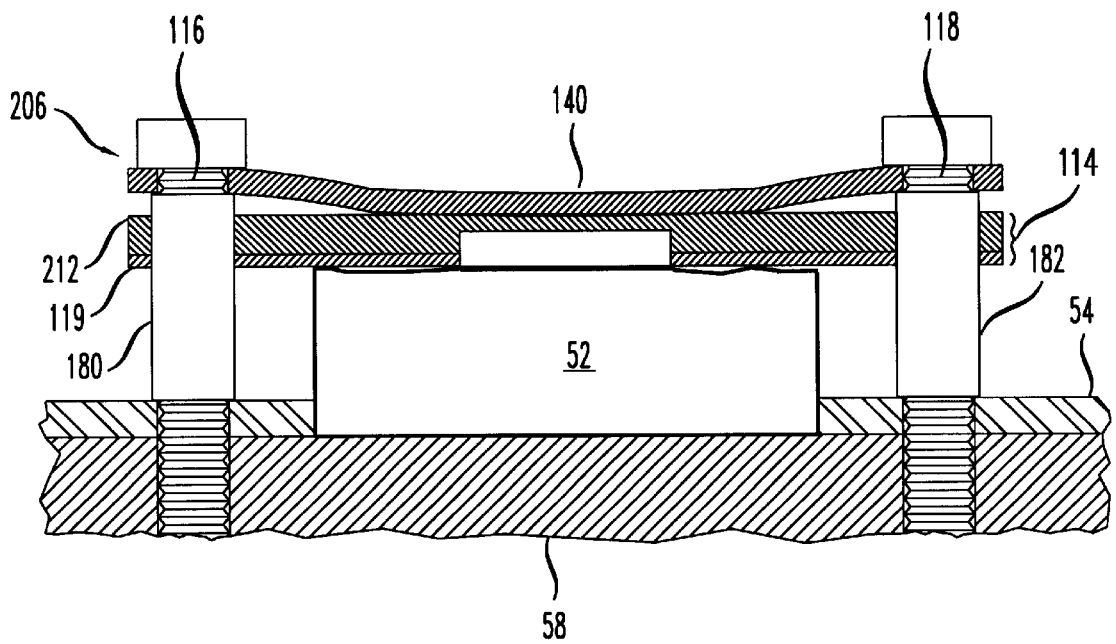
FIG. 11 is a cross-sectional view of an assembly having a circuit board and a component attached to the circuit board by an alternative spring clamp.

In an alternative embodiment, shown in FIG. 11, assembly 200 has clamp 206 that includes spacer structure 114, screws 116, 118, and frame 212. Frame 212 has a top section with deflected central portion 140, and openings for screws 116, 118. However, frame 212 does not have sides or a bottom section. Optionally, clamp 206 also includes standoffs 180, 182. Standoffs 180, 182 are particularly advantageous for clamp 206 because clamp 206 does not have sides to help absorb some of the force produced by screws 116, 118. Standoffs 180, 182 absorb some of this force and help to prevent the deflection of portions of frame 212 other than central portion 140.

While the invention has been described with reference to a preferred embodiment, it will be understood by those skilled in the art having reference to the specification and drawings that various modifications may be made and various alternatives are possible therein without departing from the spirit and scope of the invention.

We claim:

1. A clamp adapted for securing a component to a circuit board, the clamp adapted for being coupled to the circuit board with at least one fastener, the clamp comprising:

a frame having a spring section a portion of which is capable of being deflected;

a spacer structure positioned between the spring section and the component; and a stopping device that absorbs some of the force exerted on the frame by the fastener.

2. The clamp of claim 1, wherein:

the spring section is a top section; and the stopping device comprises at least one standoff having a first and second end, the first end of the standoff adjacent to the top section of the frame.

3. The clamp of claim 1, wherein:

the spring section is a top section; and the stopping device comprises two sides.

4. The clamp of claim 1, wherein the spacer structure comprises FR4.

5. The clamp of claim 1, wherein the frame comprises a beryllium copper alloy.

6. The clamp of claim 1, further comprising the at least one fastener.

7. The clamp of claim 1, wherein the frame further comprises a bottom section having a component opening.

8. The clamp of claim 1, wherein the spacer structure comprises:

a first spacer adjacent to the frame; and a second spacer positioned between the first spacer and the component.

9. The clamp of claim 8, wherein:

the first spacer being substantially aluminum; and the second spacer comprising a material more compliant than aluminum.

10. The clamp of claim 8, wherein:

the first spacer has an opening positioned over a center of the component such that edges of the first spacer are positioned over walls of a package of the component.

11. The clamp of claim 8, wherein:

the second spacer has an opening positioned over a center of the component such that edges of the second spacer are positioned over walls of a package of the component.

12. An assembly comprising:

a circuit board;

a component;

clamp coupled to the circuit board; and at least one fastener coupling the circuit board to the clamp;

the clamp having:

a frame including a first section a portion of which is capable of being deflected;

a spacer structure positioned between the first section and the component; and a stopping device that absorbs some of the force exerted on the frame by the at least one fastener.

13. The assembly of claim 12, wherein:

the first section is a top section; and the stopping device comprises at least one standoff positioned between the first section of the frame and the circuit board.

14. The assembly of claim 12, wherein the first section is a top section, and the stopping device comprises two sides.

15. The assembly of claim 12, wherein the spacer structure comprises FR4.

16. The assembly of claim 12, wherein the frame comprises a beryllium copper alloy.

17. The assembly of claim 12, wherein the frame further comprises a bottom section having a component opening.

18. The assembly of claim 12, wherein the spacer structure comprises:

a first spacer adjacent to the frame; and a second spacer positioned between the first spacer and the component.

19. The assembly of claim 18, wherein:

the first spacer being substantially aluminum, the first spacer has an opening positioned over a center of the component such that edges of the first spacer are positioned over walls of a package of the component; and the second spacer comprising a material more compliant than aluminum.

20. The assembly of claim 18, wherein:

the second spacer has an opening positioned over a center of the component such that edges of the second spacer are positioned over walls of a package of the component.

21. A clamp adapted for securing a component to a circuit board, the clamp comprising:

a frame; and a spacer structure positioned between the frame and the component, the spacer structure having an opening through at least a portion of the spacer structure, the opening positioned over a center of the component such that edges of the spacer structure are positioned over walls of a package of the component.

22. The clamp of claim 21, further comprising a standoff positioned between the frame and the circuit board.

23. The clamp of claim 21, wherein the frame comprises:

a top section a portion of which is capable of being deflected;

two sides; and a bottom section having a component opening.

24. The clamp of claim 21, wherein the spacer structure comprises FR4.

25. The clamp of claim 21, wherein the frame comprises a beryllium copper alloy.

26. The clamp of claim 21, wherein the spacer structure comprises:

a first spacer adjacent to the frame; and a second spacer positioned between the first spacer and the component.

27. The clamp of claim 26, wherein:

the first spacer being substantially aluminum, the opening through at least a portion of the spacer structure including an opening in the first spacer, the opening being located over a center of the component such that edges of the first spacer are positioned over walls of a package of the component; and the second spacer comprising a material more compliant than aluminum.

28. The clamp of claim 26, wherein:

the second spacer has an opening positioned over a center of the component such that edges of the second spacer are positioned over walls of a package of the component.

* * * * *